(12) United States Patent
Lage et al.

(10) Patent No.: US 6,686,633 B1
(45) Date of Patent: Feb. 3, 2004

(54) SEMICONDUCTOR DEVICE, MEMORY CELL, AND PROCESSES FOR FORMING THEM

(75) Inventors: Craig S. Lage, Austin, TX (US); Mousumi Bhat, Austin, TX (US); Yeong-Jyh Tom Lii, Austin, TX (US); Andrew G. Nagy, Austin, TX (US); Larry E. Frisa, Radebeul bei Dresden (DE); Stanley M. Filipiak, Pflugerville, TX (US); David L. O'Meara, Austin, TX (US); T. P. Ong, Austin, TX (US); Michael P. Woo, Austin, TX (US); Terry G. Sparks, Austin, TX (US); Carol M. Gelatos, Redwood City, CA (US)

(73) Assignee: Motorola, Inc., Schaumburg, IL (US)

( * ) Notice: Subject to any disclaimer, the term of this patent is extended or adjusted under 35 U.S.C. 154(b) by 130 days.

(21) Appl. No.: 09/653,338

(22) Filed: Aug. 31, 2000

Related U.S. Application Data

(62) Division of application No. 08/997,714, filed on Dec. 23, 1997, now Pat. No. 6,184,073.

(51) Int. Cl.[7] .................. H01L 29/76; H01L 29/94; H01L 31/062; H01L 23/48; H01L 23/52
(52) U.S. Cl. .................. 257/392; 257/396; 257/403; 257/404; 257/734; 257/750; 257/758
(58) Field of Search .................. 257/392, 369, 257/903, 758, 904, 734, 750, 760, 776; 438/238

(56) References Cited

U.S. PATENT DOCUMENTS

| | | | |
|---|---|---|---|
| 4,908,688 A | 3/1990 | Lund et al. .................. 357/41 |
| 4,966,870 A | 10/1990 | Barber et al. ................ 437/228 |
| 5,037,777 A | 8/1991 | Mele et al. .................. 437/195 |
| 5,066,615 A | 11/1991 | Brady et al. ................. 437/229 |
| 5,091,244 A | 2/1992 | Biornard ..................... 428/216 |
| 5,219,793 A | 6/1993 | Cooper et al. .............. 437/195 |
| 5,416,736 A | * 5/1995 | Kosa et al. .................. 365/174 |
| 5,428,244 A | 6/1995 | Segawa et al. ............. 257/646 |
| 5,488,246 A | 1/1996 | Hayashide et al. ......... 257/336 |

(List continued on next page.)

FOREIGN PATENT DOCUMENTS

JP 8-264770 11/1996 ........... H01L/29/78

OTHER PUBLICATIONS

Craig Lage et al., "Advanced SRAM Technology—the Race Between 4T and 6T Cells", 1996 IEEE, pp. 11.1.1–11.1.4.

(List continued on next page.)

*Primary Examiner*—Wael Fahmy
*Assistant Examiner*—Shrinivas H Rao
(74) *Attorney, Agent, or Firm*—Patricia S. Goddard; Kim-Marie Vo

(57) ABSTRACT

A semiconductor device includes a memory array of static-random-access memory cells. The SRAM cells are formed using a process flow more closely associated with logic-type devices. The SRAM cells are formed using one semiconductor layer compared to at least three typically seen with SRAM cells. The SRAM cells include many features that allow its dimensions to be scaled to very small dimensions (less than 0.25 microns and possible down to 0.1 microns or even smaller). A unique process integration scheme allows formation of local interconnects (522 and 524), wherein each local interconnect (522, 524) cross couples the inverters of the SRAM and is formed within a single opening (70). Also, interconnect portions (104) of word lines are laterally offset from silicon portions (36) of the same word line, so that the interconnect portions do not interfere with bit line connections.

20 Claims, 11 Drawing Sheets

U.S. PATENT DOCUMENTS

| | | | |
|---|---|---|---|
| 5,525,542 A | | 6/1996 | Maniar et al. .............. 437/186 |
| 5,536,962 A | | 7/1996 | Pfiester ....................... 257/392 |
| 5,539,249 A | | 7/1996 | Roman et al. .............. 257/649 |
| 5,734,179 A | * | 3/1998 | Chang et al. ................. 257/67 |
| 5,792,684 A | | 8/1998 | Lee et al. .................... 438/238 |
| 5,824,579 A | | 10/1998 | Subramanian et al. ...... 438/238 |
| 5,891,775 A | | 4/1999 | Hisamune ................... 438/267 |
| 5,918,147 A | | 6/1999 | Filipiak et al. ............. 438/636 |
| 5,961,791 A | | 10/1999 | Frisa et al. ............. 204/192.1 |
| 5,994,180 A | | 11/1999 | Uchida ........................ 438/238 |
| 6,015,996 A | * | 1/2000 | Lee ............................. 257/393 |
| 6,100,568 A | * | 8/2000 | Lage .......................... 257/392 |

OTHER PUBLICATIONS

Masaki Katsube et al., "Technologies for 0.25$\mu$m CMOS Logic Devices", Fujitsu Sci. Tech. J., 32, 1, Jun. 1996, pp. 94–101.

J. Givens et al., "Selective dry etching in a high density plasma for 0.5$\mu$m complementary metal–oxide–semiconductor technology", J. Vac. Sci. Technology B, vol. 12, No. 1, Jan./Feb. '94, 6 pgs.

F. White et al., "Damascene Stud Local interconnect In CMOS Technology", 1992 IEDM, pp. 11.5.1–11.5.4.

K.H.Kuesters et al., "Self Aligned Bitline Contact for 4 Mbit DRAM", The Electrochemical Society, Inc. Proceedings vol. 87–11, pp. 640–649.

David Krakauer et al, "ESD Protection in a 3.3V Sub–Micron Silicided CMOS Technology", Electrical Overstress/Electrostatic Discharge Symp.Proceedings, 1992, Dallas, TX, pp. 5B4.1–5B.4.8.

E. Kolawa et al., "Sputtered Ta–Si–N Diffusion Barriers in Cu Metallizations for Si", 1991 IEEE, Electron Device Letters, vol. 12, No. 6, Jun. 1991, pp. 321–323.

Charvaka Duvvury, "ESD Reliability for Advanced CMOS Technologies", 1990 Int'l. Electron Devices and Materials Symposium, Nov. 14–16, 1990, pp. 265–272.

* cited by examiner

US 6,686,633 B1

SEMICONDUCTOR DEVICE, MEMORY CELL, AND PROCESSES FOR FORMING THEM

RELATED APPLICATIONS

This is a division of U.S. patent application Ser. No. 08/997,714, filed on Dec. 23, 1997. U.S. Pat. No. 6,104,073 which is hereby incorporated by reference, and priority thereto for common subject matter is hereby claimed.

This is related to U.S. patent application Ser. No. 08/804,589 filed Feb. 26, 1997, Ser. No. 08/632,207 filed Apr. 15, 1997, Ser. No. 08/413,021 filed Mar. 29, 1995, and Ser. No. 08/963,580 filed Nov. 6, 1997, both of which are assigned to the current assignee hereof.

FIELD OF THE INVENTION

This invention relates in general to semiconductor devices, and more particularly, to semiconductor devices having memory arrays with memory cells and processes for forming them.

BACKGROUND OF THE INVENTION

As device dimensions continue to shrink and the need to interconnect components within a semiconductor device increase, a need exists for advanced interconnecting systems that are robust and can be used for a variety of components in a semiconductor device. In many instances, these local interconnects may be made between a gate electrode and a source/drain region within a semiconductor substrate. When making this connection, difficulty can occur when etching an opening to extend through a thick insulating layer down to the gate electrode and the source/drain region. The gate electrode is etched for a longer time compared to the source/drain region because the gate electrode typically lies at a higher elevation than the source/drain region.

Some attempts to solve this problem include using etch-stop films. More specifically, a plasma enhanced nitride film can be formed over a gate electrode and a doped region within a substrate. A very thick oxide film is formed and planarized. The plasma enhanced nitride film over the gate electrode may be completely etched away before all the thick oxide film is etched over the source/drain region. This can occur because the etch selectivity between thick oxide film and plasma enhanced nitride is poor (typically less than 8:1).

Increasing the plasma enhanced nitride film thickness is not a good option because etch-stop films are typically less than 1000 angstroms thick, and the increased nitride thickness may make subsequent patterning of the etch-stop film more difficult. Increasing the thickness of the plasma enhanced silicon nitride film will increase the amount of nonuniformity in the remaining film thickness after the thick oxide film etch. Further, etch steps intended for removal of the plasma enhanced silicon nitride film will propagate the nonuniformity which is expected to cause loss of isolation at the most severely etched weak spots while still not clearing the film over source/drain regions. Also, the increased thickness of the plasma enhanced nitride film increases capacitive coupling to other conductors on the device.

In yet another attempt to solve the problem, a thin oxide film may underlie a nitride etch-stop film that is covered by the thick oxide film. Again, when etching through the thick oxide film, the nitride etch-stop film can be etched during the thick oxide film patterning. After the nitride etch-stop film is etched, the oxide etchants quickly remove the thin oxide film.

In still another attempt, a nitride film, an etch-stop polysilicon film, and a phosphorous glass film are sequentially formed. An opening is formed through the phosphorus glass film the etch-stop polysilicon film as an etch-stop film. The structure is subjected to a high pressure steam oxidation is performed and converts the etch-stop polysilicon to a thermal oxide film. An etch step is performed to extend the opening through the thermal oxide and nitride films. The high-pressure steam oxidation may cause undesired oxidation of other features present, such as gate electrodes.

A semiconductor device with a static random access memory (SRAM) memory cells are particularly prone to such contact problems when forming the cross-coupling between the storage nodes and the latch transistors. Referring to FIG. 1, SRAM cell 10 includes a pair of pass transistors 11 and 12 that are connected to a bit line (BL) and a complementary bit line ($\overline{BL}$), respectively. The other portion of transistor 11 is connected to the drains of the n-type latch transistor 13 and the p-type load transistor 15. The other portion of the pass transistor 12 is connected to the drains of n-channel latch transistor 14 and p-channel load transistor 16. As seen in FIG. 1, the gate electrodes of the latch transistor 13 and load transistor 15 are connected to the drains of transistors 14 and 16. Also, the gate electrodes of transistors 14 and 16 are connected to the drains of transistors 13 and 15. The sources of transistors 13 and 14 are connected to a $V_{SS}$ electrode, and the sources of the transistors 15 and 16 are connected to a $V_{DD}$ electrode. The gate electrodes for pass transistors 11 and 12 are part of a word line and are electrically connected to each other. In this particular SRAM cell 10, difficulty is typically encountered when trying to cross-couple the inverters within the SRAM cell.

BRIEF DESCRIPTION OF THE DRAWINGS

The present invention is illustrated by way of example, and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiment(s) of the present invention.

DETAILED DESCRIPTION

A semiconductor device includes a memory array of static-random-access memory cells. The SRAM cells are formed using a process flow more closely associated with logic-type devices (i.e., microcontrollers, microprocessors, etc.). The SRAM cells are formed using one semiconductor (i.e., silicon, germanium, etc.) layer compared to at least three typically seen in other SRAM cells. The SRAM cells include many features that allow its dimensions to be scaled to very small dimensions (less than 0.25 microns and possible down to 0.1 microns or even smaller). A unique process integration scheme allows formation of local interconnects, wherein each local interconnect cross couples the inverters of the SRAM and is formed within a single opening. Other features are discussed below. The present invention will be better understood with the detailed description that follows.

Figure 1:
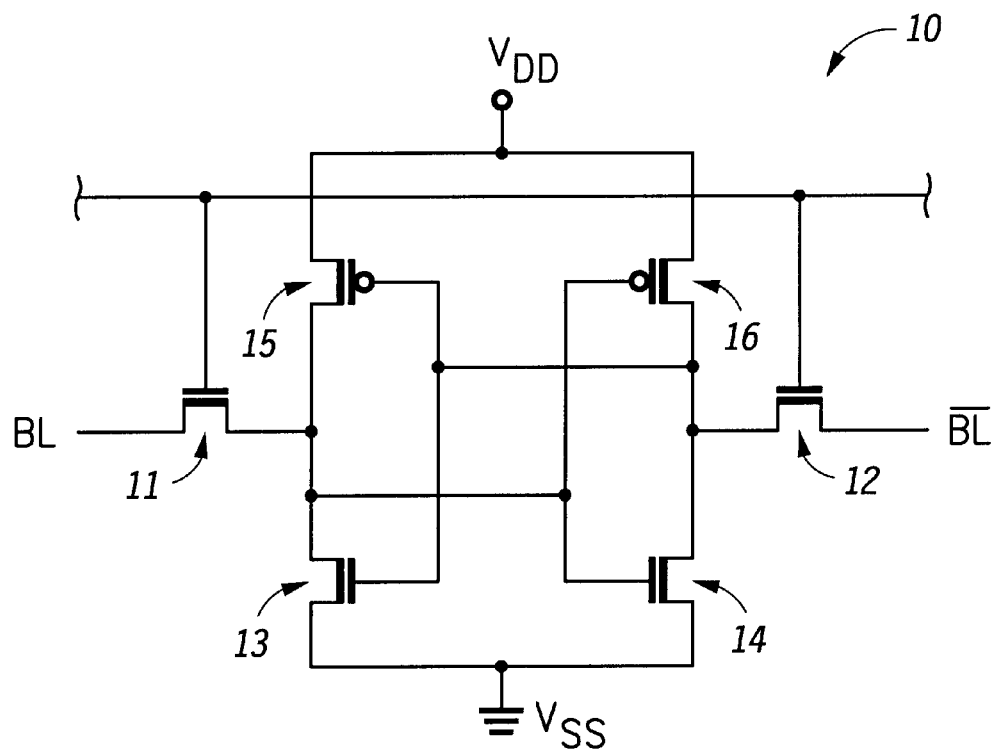
FIG. 1 includes a schematic diagram of a six transistor SRAM cell (prior art)
Figure 2:
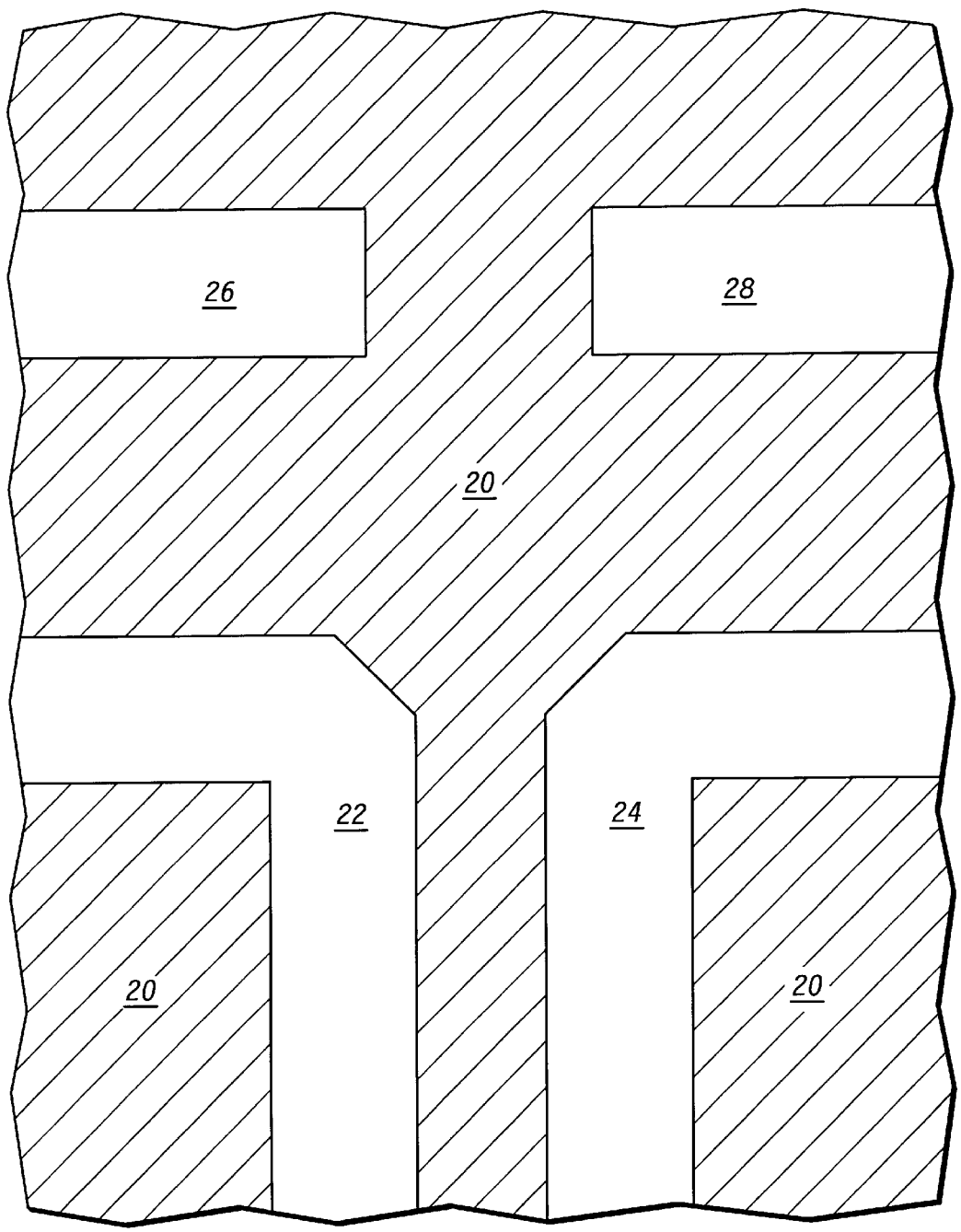
FIG. 2 includes an illustration of a top view of a partially formed SRAM cell after forming field isolation regions.

FIG. 2 includes an illustration of a top view of a portion of a semiconductor device having a memory array where an SRAM cell, a part of which is being formed from a semiconductor device substrate. As used in this specification, a semiconductor device substrate includes a monocrystalline semiconductor wafer, a semiconductor-on-insulator wafer or any other type of substrate used to form semiconductor devices. In this particular embodiment, the semiconductor device substrate includes a monocrystalline semiconductor wafer and an overlying epitaxial layer. The primary surface of the semiconductor device substrate is the surface in which portions of components (i.e., transistors, etc.) are formed.

As shown in FIG. 2, field isolation regions 20 are formed to define active regions 22, 24, 26 and 28. The field isolation regions 20 are formed by conventional means, and more specifically, are formed using a shallow trench isolation process in this embodiment. A series of implant doping steps are performed to form well regions after the field isolation regions 20 have been formed. Active regions 22 and 24 are lightly doped p-type silicon and active regions 26 and 28 are lightly doped n-type silicon. The active regions 22 and 24 are typically part of a p-well region and active regions 26 and 28 are typically part of an n-well region. Lightly doped regions, such as well regions, have doping concentrations no higher than approximately 1E18 atoms per cubic centimeter.

A gate dielectric layer is formed over the active regions 22, 24, 26 and 28, but is not illustrated in FIG. 2. A semiconductor layer is deposited over the active regions 22, 24, 26, and 28 and field isolation regions 20. The semiconductor layer has a thickness in a range of approximately 1000–3000 angstroms.

An optional implant screen layer (i.e., thin oxide layer) is formed over the semiconductor layer but is not shown. The implant screen layer has a thickness in a range of 50–200 angstroms. A masking layer (not shown) is then formed over the semiconductor layer such that most, if not all, peripheral areas (outside the memory array) are covered. The semiconductor layer within the memory array is exposed. A dopant is then introduced into the exposed portions of the semiconductor layer, and then the masking and implant screen layers are removed.

An insulating capping layer is formed over the semiconductor layer. The insulating capping layer typically has an etch rate dissimilar to silicon dioxide. However, in some specific embodiments, the insulating capping layer can be an oxide layer formed using tetraethyl orthosilicate (TEOS). The insulating capping layer can include a plurality of films. The insulating capping layer is typically a nitride film and has a thickness in the range of approximately 700–1500 angstroms.

Figure 3:
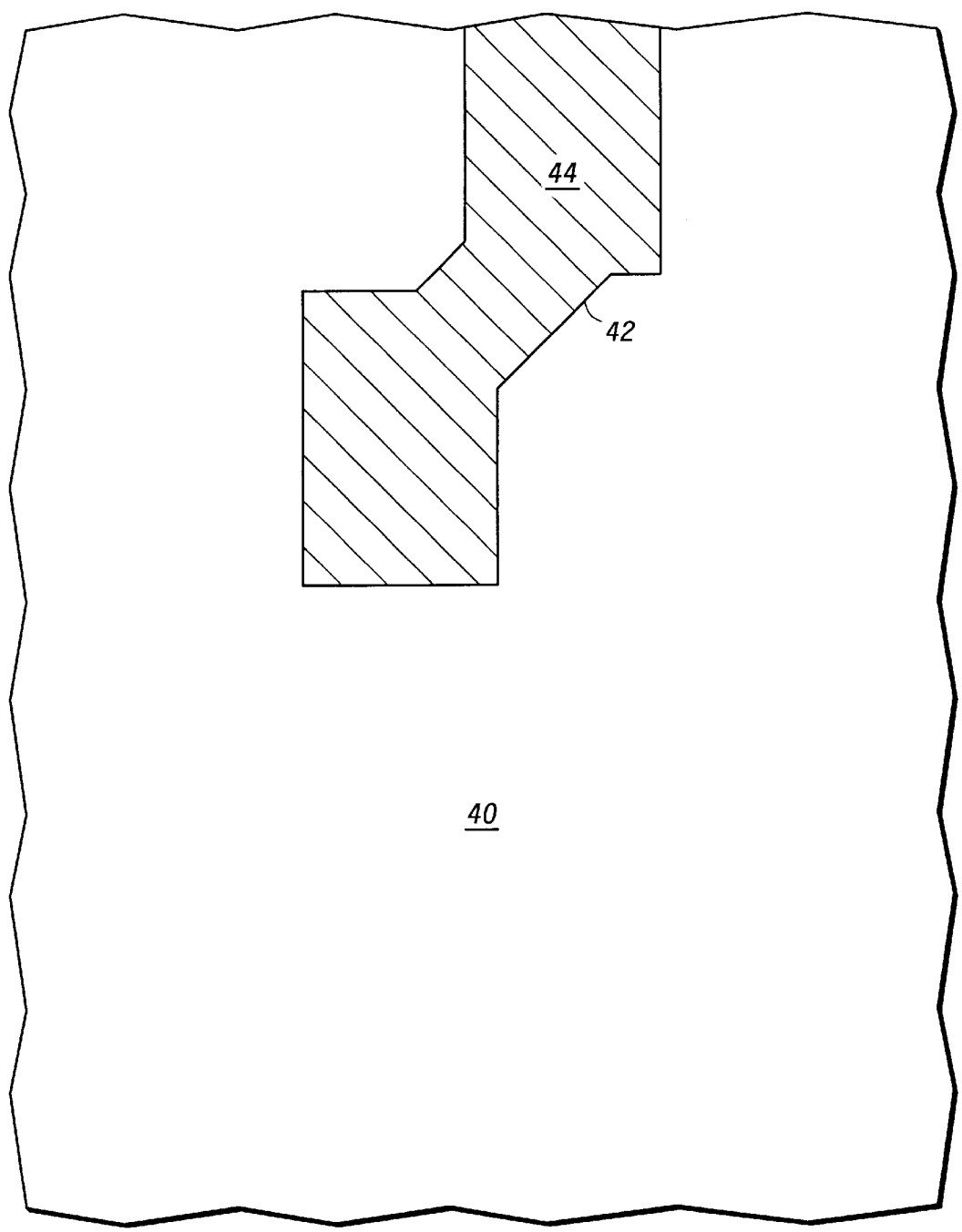
FIG. 3 includes an illustration of a top view of the memory cell of FIG. 2 after forming a masking layer over an insulating capping layer in accordance with an embodiment of the present invention.

A masking layer 40 is then coated over the insulating capping layer 44 and patterned to form openings 42, one of which is illustrated in FIG. 3. Within the memory array, some of the insulating capping layer 44 is exposed. These areas within the memory array correspond to locations where the semiconductor layer will be electrically connected to drain regions of latch and load transistors (cross coupling of the inverters). Outside the memory array, all the insulating capping layer 44 is not covered by the masking layer 40, with the possible exception of areas where input protection transistors are being formed. An etching step is performed to remove the insulating capping layer 44 that overlies the semiconductor layer for all areas not covered by the masking layer 40. The masking layer 40 is removed after etching, and an antireflective layer (not shown) is formed over the insulating capping layer 44 and exposed portions of the semiconductor layer. The antireflective layer is typically formed by depositing a nitride, such as silicon-rich silicon nitride, and has a thickness in a range of approximately 100–400 angstroms.

A masking layer (not shown) is formed over the antireflective layer and is patterned. The portions of antireflective layer, insulating capping layer 44, where present, and semiconductor layer not covered by the patterned masking layer are removed to form conductive members 32, 34, and 36 that include the semiconductor layer. After patterning, the insulating capping layer has sides that are substantially coterminous with its underlying conductive member.

Figure 4:
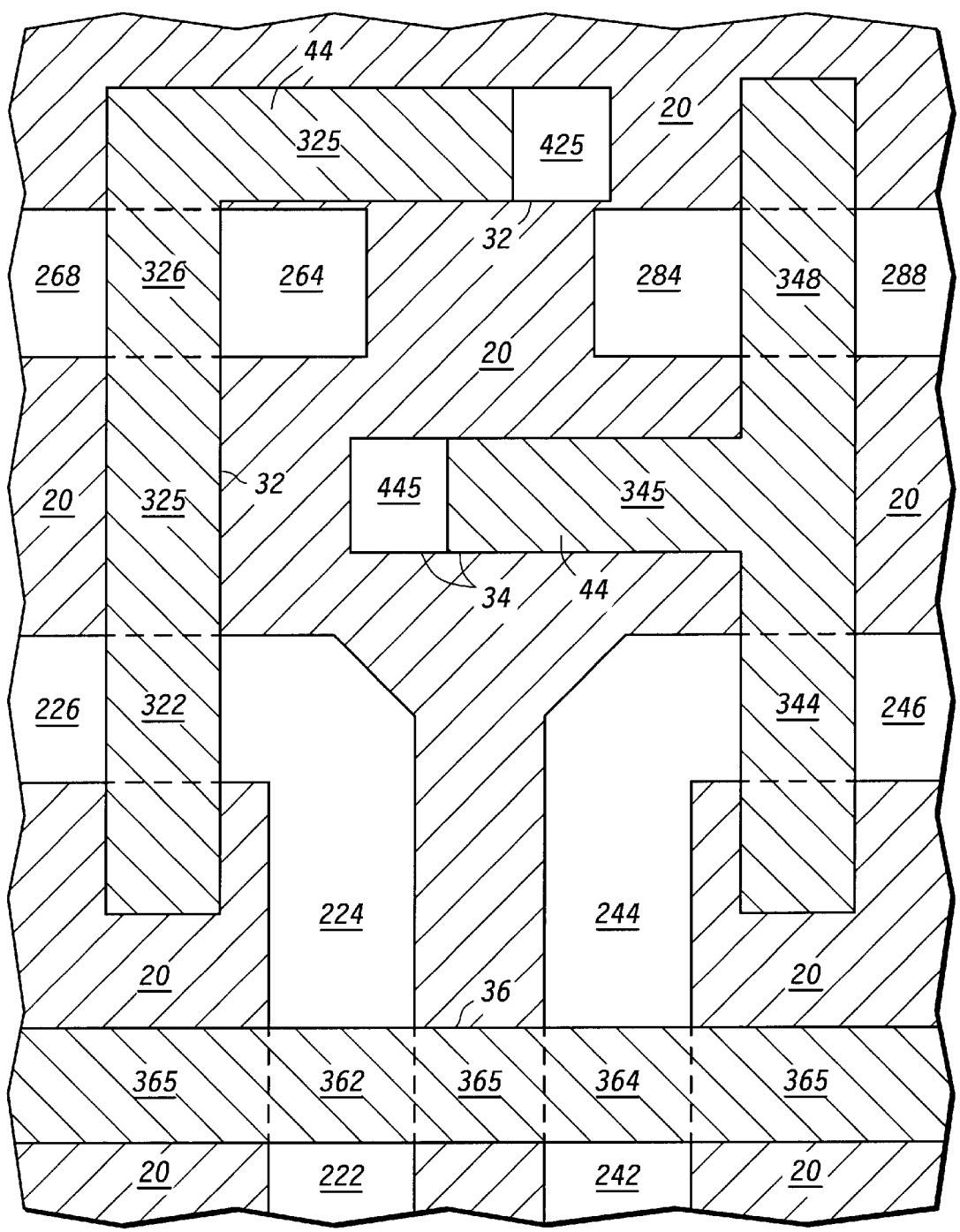
FIG. 4 includes an illustration of a top view of the memory cell of FIG. 3 after removing portions of an insulating capping layer over the conductive members in accordance with an embodiment of the present invention.

Referring to FIG. 4, conductive member 32 includes a latch transistor gate electrode section 322, a load transistor gate electrode section 326, and interconnect sections 325. As used in this specification, the interconnect sections are portions of the conductive members that overlie the field isolation regions 20 and are typically used to connect the gate electrode sections to each other or other portions of the memory cell or device. Conductive member 34 includes a latch transistor gate electrode section 344, a load transistor gate electrode section 348, and an interconnect section 345. The conductive member 36 includes pass transistor gate electrode sections 362 and 364 and interconnect sections 365. The conductive member 36 is part of a word line for the memory array. The gate electrode sections are gate electrodes for their respective transistors.

The masking layer and antireflective layer are removed after conductive members 32, 34, and 36 are formed. The antireflective layer is removed using a dry etching process. A protective layer, such as a silicon oxide layer, is formed over the conductive members and has a thickness in a range of approximately 50–200 angstroms.

N+ and P+ source/drain doping is then performed. An n-type dopant, including phosphorus, arsenic, or the like, is used to dope portions of active regions 22 and 24 (as seen in FIG. 2) to form N+ doped regions 222, 224, 226, 242, 244, and 246 to a dopant concentration of at least 1E19 atoms per cubic centimeter as shown in FIG. 4. A p-type dopant, including boron or the like, will be used to dope portions of active regions 26 and 28 to form P+ doped regions 264, 268, 284, and 288 to a dopant concentration of at least 1E19 atoms per cubic centimeter. These form source, drain, and source/drain regions (current carrying electrodes) for the semiconductor device. Note that similar doping occurs for the peripheral circuits, wherein n-channel transistors receive the n-type doping and p-channel transistors receive the p-type doping. An anneal is typically performed to activate the dopants. In the peripheral areas of the semiconductor device, the semiconductor layer is doped with the N+ or P+ doping to form gate electrodes for n-channel and p-channel transistors.

A spacer formation layer is formed over the protective layer and other portions of the substrate. Typically, the spacer formation layer is a silicon nitride layer having a thickness in a range of approximately 500–800 angstroms. Similar to the insulating capping layer, the spacer formation can be an oxide layer formed using TEOS. Other materials could be used for the spacer formation layer. The spacer formation layer is anisotropically etched to form spacers adjacent to the conductive members.

At this point in the process, shapes of some features are noted. The combination of the insulating capping layer 44, protective layer, and sidewall spacers form a composite insulating layer. The shape of the composite insulating layer is substantially similar to the shape of the conductive members 32, 34, and 36. Other than the portions 425 and 445, the composite insulating layer covers and laterally surrounds the conductive members 32 and 34. In FIG. 4, the locations of the insulating capping layer 44 over the conductive members 32, 34, and 36 are shown because this is the primary insulating layer that overlies the conductive members 32, 34, and 36. Portions 425 and 445 of the conductive members 32 and 34 are not covered by the insulating capping layer 44. The other layers that make up the composite insulating layer, including the sidewall spacers are not illustrated in top views, such as FIG. 4, to simplify understanding of the layout.

A salicide process is then performed to form silicide regions over portions 425 and 445 of the conductive members 32 and 34 and over doped regions 222, 242, 226, 242, 244, 246, 264, 268, 284, and 288. This processing sequence also form silicide over N+ and P+ doped regions and nearly all of the remaining semiconductor layer for the peripheral areas, which are outside the memory array. Other than input protection circuitry, the gate electrodes for transistors in the peripheral areas are silicided. The silicide regions include titanium silicide (TiSi$_2$), cobalt silicide (CoSi$_2$), nickel silicide (NiSi), palladium silicide (Pd$_2$Si), tantalum silicide (TaSi$_2$), molybdenum silicide (MoSi$_2$), platinum silicide (PtSi), or the like.

Figure 5:
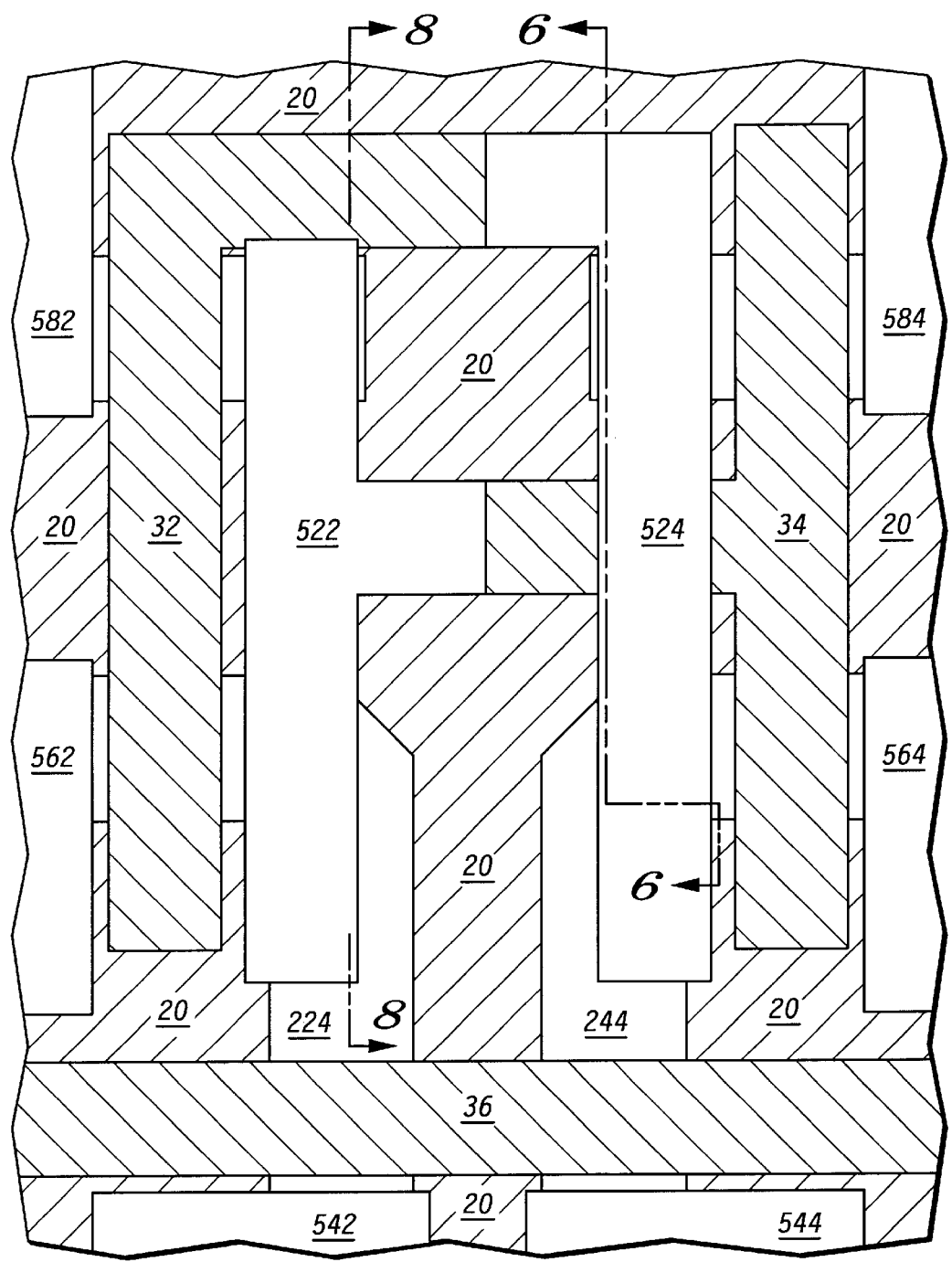
FIG. 5 includes an illustration of a top view of the memory cell of FIG. 4 after forming conductive members in accordance with one embodiment of the present invention.

An insulating layer that includes a plurality of insulating films is then formed over the conductive members 32, 34, and 36 and other portions of the substrate. Openings are formed through the insulating layer, and conductive members 522, 524, 542, 544, 562, 564, 582, and 584 are formed within the openings as shown in FIG. 5. Conductive members 522 and 524 are intracell straps (local inlaid interconnects) that make the electrical connections for the storage nodes. Conductive members 542, 544, 562, and 564 are contact landing pads for bit line and V$_{SS}$ connections. Conductive members 582 and 584 are intercell straps (local inlaid interconnects) that each make electrical connections to drain regions of four different memory cells, one of which is shown in FIG. 5, and are contact landing pads for V$_{DD}$ connections.

Figure 6:
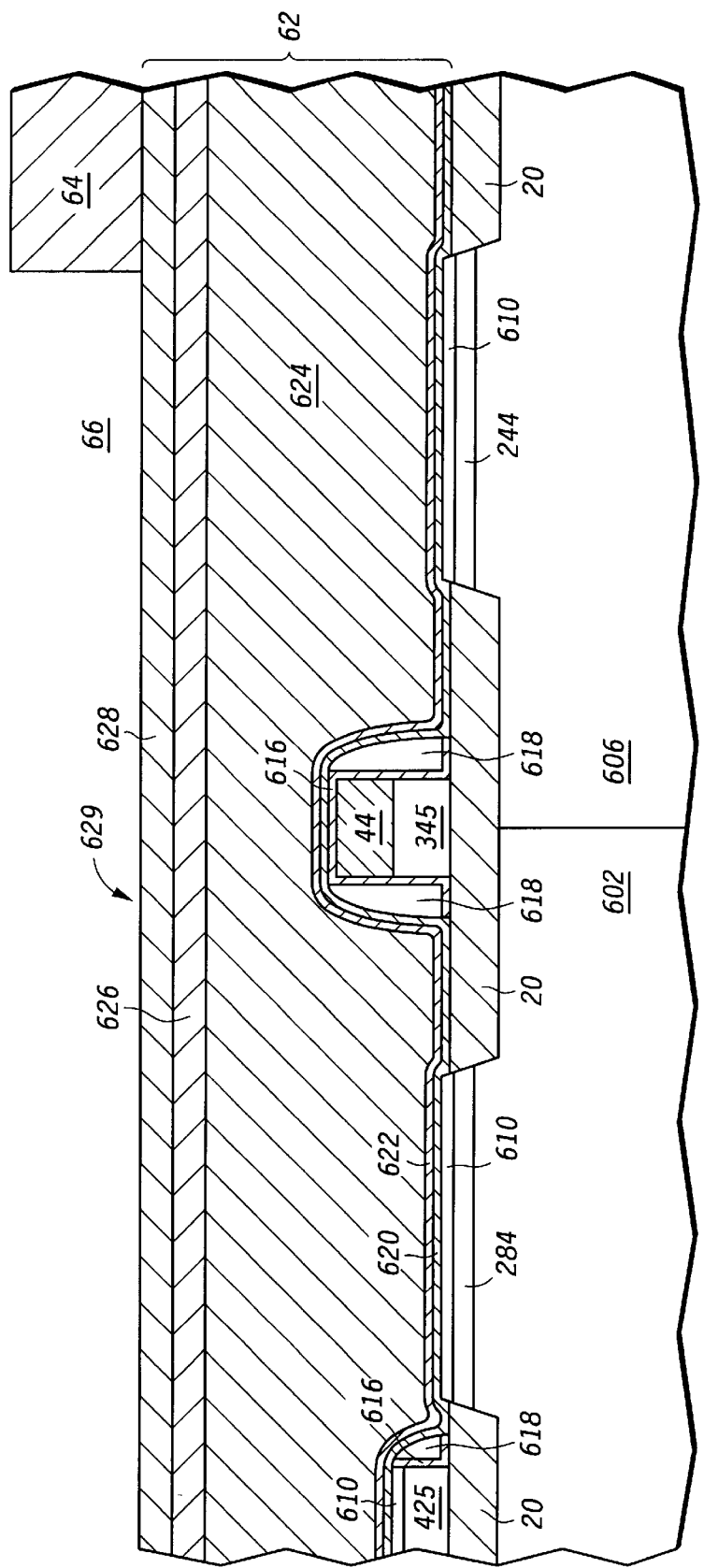
FIGS. 6–8 include illustrations of cross-sectional views of portions of the memory cell during the formation of the conductive members illustrated in FIG. 5.
Figure 7:
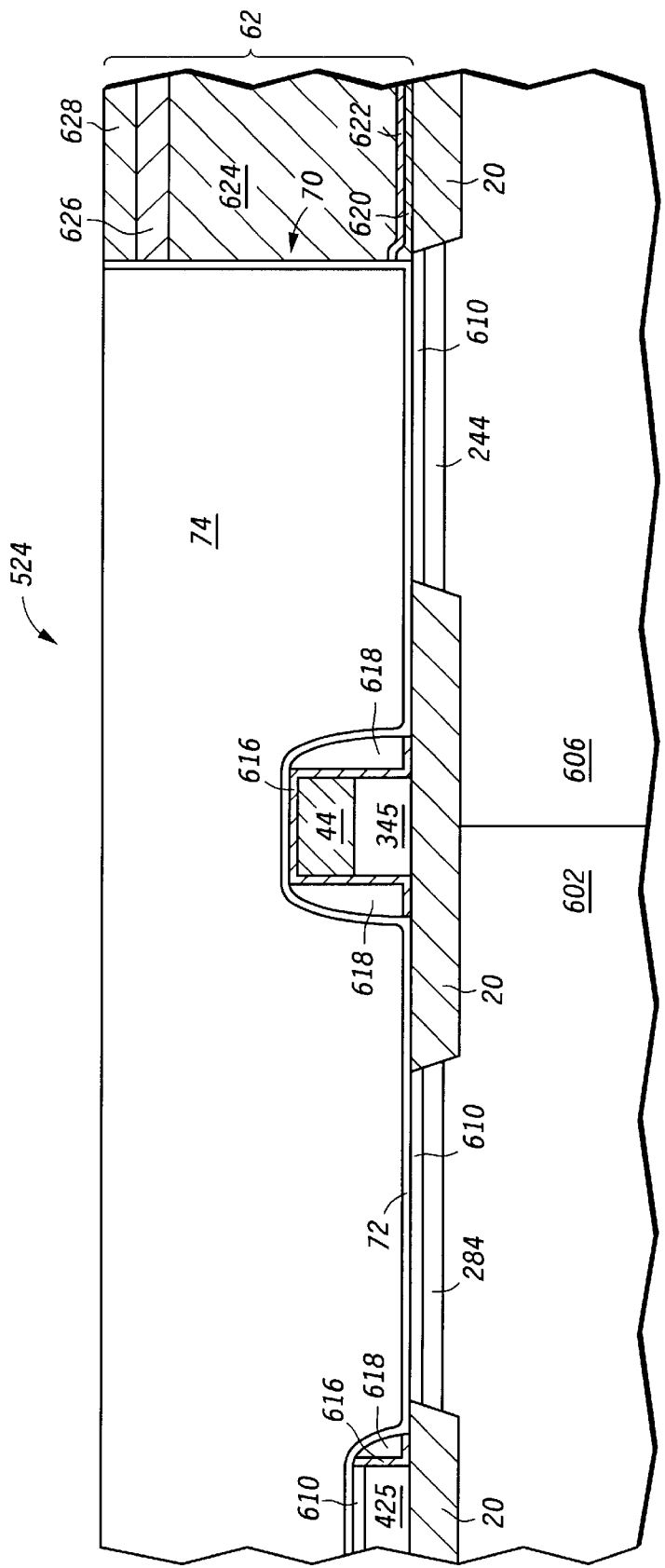
Figure 8:
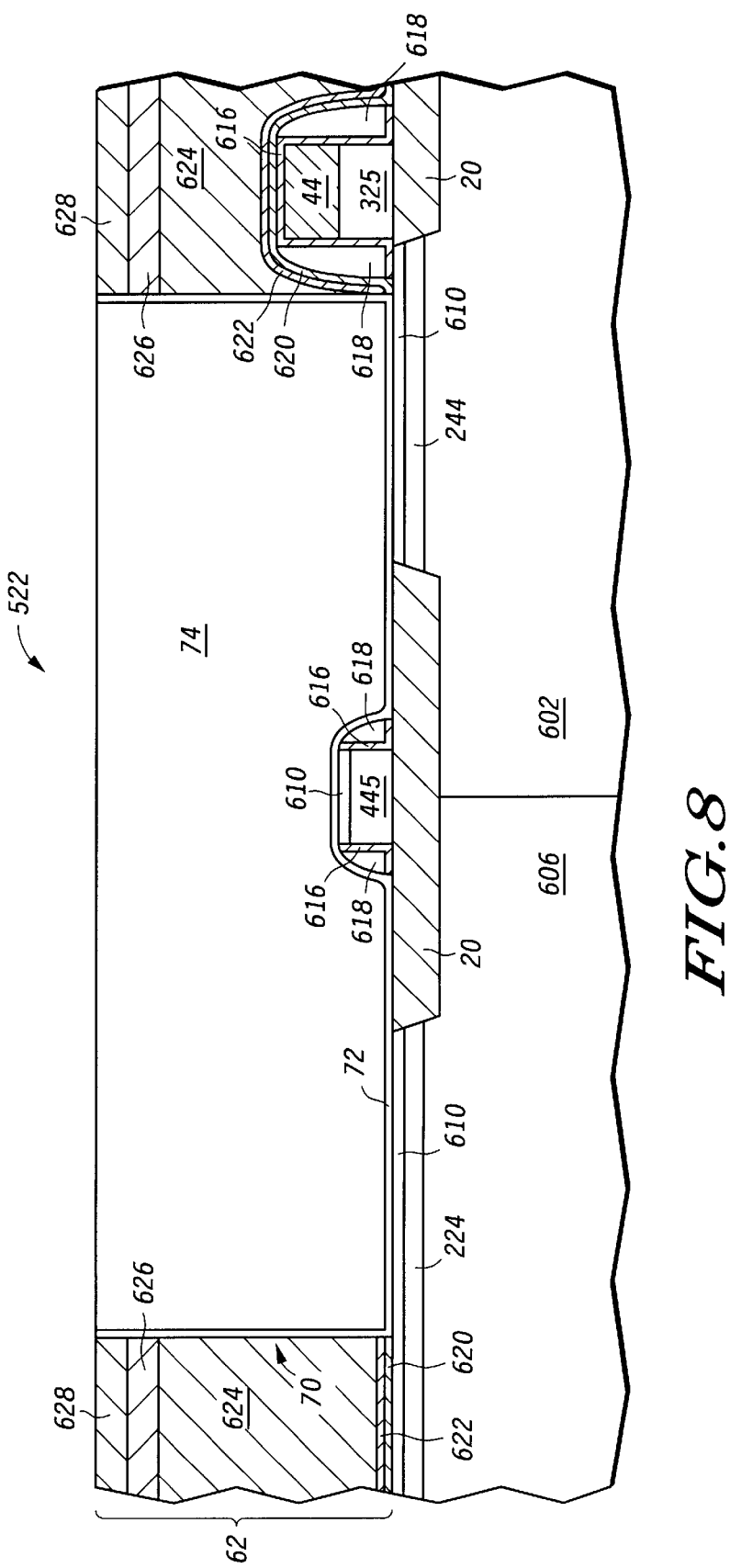

The formation of the insulating layer and conductive members have been tailored to SRAM cells formed with a process sequence more closely associated with logic devices (i.e., microprocessor, microcontrollers, or the like). Part of the focus is related to the cross-coupling of the inverters within the SRAM cell. FIGS. 6–8 include illustrations of cross-sectional views of portions of the memory cell as seen by sectioning lines 6—6 and 8—8 in FIG. 5.

FIG. 6 includes a portion of the memory cell within semiconductor device and includes N-well region 602 and P-well region 606. Field isolation regions 20, P+ doped region 284, and N+ doped region 244 lie near the primary surface of the semiconductor substrate and are formed from the well regions 602 and 606, respectively. Portion 425 of conductive member 32 and interconnect section 345 of conductive member 34 overlie portions of the field isolation regions 20. Silicide regions 610 overlie the portion 425, the P+ doped region 284, and the N+ doped region 244, but do not overlie the portion of the interconnect section 345 shown in FIG. 6. Overlying the interconnect section 345 is the insulating capping layer 44. Adjacent to portion 425 and interconnect section 345 is the protective layer 616 and insulating spacers 618. The processing up to this point has been discussed previously.

After the silicide regions 610 are formed, the substrate is then processed to deposit the insulating layer 62 that includes five films in this particular embodiment as seen in FIG. 6. In forming the conductive members 522 and 524 shown in FIG. 5, the proper electrical connections need to be made without damaging or adversely affecting other portions of the semiconductor device. Referring to FIG. 6, the first insulating film 620 is formed using a plasma oxide deposition step using, for example, tetraethylorthosilicate (TEOS or Si(OC$_2$H$_5$)$_4$) and oxygen (O$_2$). The first film has a thickness less than approximately 500 angstroms, and more usually has a thickness in a range of approximately 150–400 angstroms thick.

A second insulating film 622 is formed and includes a graded silicon nitride film and has a thickness in a range of approximately 500–1000 angstroms thick. Details on the formation of the second insulating film 622 are described later in this specification. The combined thickness of the first and second insulating films 620 and 622 should be kept to no more than about 1000 angstroms, if possible. Alternatively, the first and second insulating films 620 and 622 can be replaced by a single film of a refractory metal oxide, a metal nitride, or a low-k dielectric film. As used in this specification, a low-k dielectric film means that the film has a dielectric constant lower than silicon dioxide, which is 3.9.

A third insulating film 624 is formed over the second insulating film and typically includes doped oxide. In one specific embodiment, this film can be formed using TEOS, oxygen, trimethyl borate (TMB), and trimethyl phosphite (TMPi) to form a borophosphosilicate glass. Alternatively, other insulating films could be formed, such as a undoped oxide film or an oxide film formed using silane (SiH$_4$) or disilane (Si$_2$H$_6$). The third insulating film 624 has a thickness thicker than 1000 angstroms, and more usually is deposited to a thickness in a range of approximately 5000–15,000 angstroms.

The third insulating film 624 is planarized and capped with a fourth insulating film 626 that typically includes oxide and has a thickness in a range of approximately 1000–4000 angstroms thick. A fifth insulating film 628, which is an antireflective film, is formed over the fourth insulating film 626. The fifth insulating film 628 is typically is a silicon-rich silicon oxynitride, silicon-rich silicon nitride, or the like. The fourth and fifth insulating films 626 and 628 are optional.

The first, second, third, fourth, and fifth insulating films are formed at temperatures no higher than approximately 450 degrees Celsius to reduce the likelihood of agglomeration or other adverse effects to the silicide regions 610. However, if rapid thermal processing is used to form any of the films, the temperature during deposition may be taken as high as 750 degrees Celsius since the deposition times are typically less than five minutes. The first, third, and fourth insulating films are formed using conventional means.

The second insulating film 622 can include a graded silicon nitride film and can be formed in at least four different manners. One embodiment forms the second insulating film 622 using a "flash PEN" process. In this process, a conventional plasma enhanced nitride process is used at the beginning of the process. At least one nitrogen source gas (nitrogen ($N_2$), ammonia ($NH_3$), or the like) and a semiconductor source gas (silane ($SiH_4$), disilane ($Si_2H_6$), chlorinated silanes or disilanes, or the like) are flowing during the deposition. Typically, silane, nitrogen, and ammonia are flowing during the beginning of the process.

Instead of terminating the semiconductor source gas flow at the same time or before the nitrogen source gas flow, the nitrogen source gas flow is terminated before the semiconductor source gas flow. The time difference between terminating the two gas flows is typically in a range of approximately 0.5–15 seconds, and more usually is in a range of approximately 1–7 seconds. During this time, the nitrogen source gas within the reactor is being depleted while the semiconductor source gas continues to flow. The resulting second insulating film 622 has a graded composition that includes a higher semiconductor (i.e., silicon) concentration at the surface near the third insulating film 624. This increased silicon concentration gives a better etch selectivity compared to the third insulating film 624.

Alternatively, the second insulating film 622 is formed using rapid thermal chemical vapor deposition using conventional parameters for silicon nitride deposition at the beginning of the process. A semiconductor source gas (i.e., $SIH_4$ or the like) and a nitrogen source gas (i.e., $NH_3$ or the like) flow at a gas flow ratio in a range of approximately 1:8 to 1:12. Similar to the "flash PEN" process, the first portion of the deposition forms a silicon nitride film having a substantially stoichiometric ratio. However, near the end of the deposition, the nitrogen source gas flow is terminated for a time period in a range of 5–10 seconds before reducing or terminating the semiconductor source gas. Although this film is typically formed at a temperature higher than the "flash PEN" process, this rapid thermal process provides a film typically having better electrical characteristics.

Note that embodiments of the present invention do not require terminating all the nitrogen source gas before terminating the semiconductor source gas. The ratio of the semiconductor source gas flowrate to the nitrogen source gas flowrate increases near the end of the deposition of the second insulating film 622. Therefore, the nitrogen source gas flowrate can be decreased, but not necessarily terminated, before the semiconductor source gas flowrate is terminated.

In still another method, the graded silicon nitride film can be formed using a conventional plasma-enhanced silicon nitride film deposition. Following deposition, the conventional plasma-enhanced silicon nitride film is implanted with ions of silicon, germanium, or the like to increase the semiconductor content near the upper surface of the film. If silicon ions are used, the acceleration energy is in a range of approximately 5–50 kiloelectron volts, and a dose is at least 1E15 ions per square centimeter.

Conversely, a semiconductor film (i.e., silicon, germanium, silicon germanium, or the like) can be deposited by plasma-enhanced chemical vapor deposition. The semiconductor film is implanted with nitrogen ions. Alternatively, the semiconductor film can be implanted with oxygen, argon, or carbon to increase its resistivity. The ions are implanted into the semiconductor film at an acceleration energy in a range of approximately 5–50 kiloelectron volts to a dose of at least 1E15 ions per square centimeter.

In still another embodiment, the graded nitride film can be replaced by a combination of a plasma-enhanced silicon nitride film and a semiconductor film over the silicon nitride film. The thickness of the semiconductor film is no more than approximately 100 angstroms, and typically is no more than approximately 50 angstroms. Ion implantation to increase resistivity, as described in the preceding paragraph, is optional.

In yet another embodiment, the graded silicon nitride film can be formed using a reactive sputtering process. At the beginning of the sputter deposition, a plasma including nitrogen and argon is directed towards a silicon target. Most of the deposition is designed to deposit a film having a silicon:nitrogen ratio of 3:4. Near the end of the deposition the ratio of nitrogen:argon in the plasma is decreased to increase the silicon:nitrogen ratio in the deposited film near its upper surface. After the implantation method or the sputter deposition method, an anneal is typically performed.

The graded silicon nitride film can be replaced by a semiconductor-rich nitride film (i.e., silicon-rich silicon nitride) having a substantially uniform composition throughout its thickness. This film is formed by a conventional method.

The first and second insulating films 620 and 622 can be replaced by a single film of a refractory metal oxide (titanium dioxide ($TiO_2$), tantalum pentoxide ($Ta_2O_5$) or the like) or metal nitride (aluminum nitride (AlN), tantalum silicon nitride ($Ta_xSi_yN_z$) or the like). These films can be formed by depositing a metal or metal compound film and then oxidizing the sputtered film in an oxygen environment which usually includes annealing, a radio frequency (RF) oxygen plasma, or the like. Alternately, the refractory metal oxide can be deposited by sputtering the refractory metal or refractory metal compound in a plasma containing oxygen. A metal nitride film can be formed by sputtering the metal or metal compound in a plasma containing nitrogen.

Tantalum silicon nitride ($Ta_xSi_yN_z$) and tantalum nitride are formed by reactivity sputtering tantalum silicide or tantalum with a plasma including nitrogen. By adjusting the amount of nitrogen in the plasma, insulating tantalum-based films can be formed. In order for tantalum silicon nitride to be insulating, the nitrogen flow rate should be adjusted so that the atomic percentage nitrogen in the film is least 45 atomic %, and more usually is greater than 55 atomic %. A 55 atomic % nitrogen concentration in the film corresponds to a nitrogen-to-argon gas ratio of approximately 3:1 in the sputtering chamber. For tantalum nitride to be insulating, the nitrogen-to-argon gas ratio is much higher, usually greater than 5:1. For tantalum silicon nitride and tantalum nitride, higher nitrogen-to-argon gas ratios are used when forming insulating films compared to their corresponding conductive films.

The fifth insulating film 628 is formed by a plasma reaction of silane, ammonia ($NH_3$), and nitrous oxide ($N_2O$). Although silicon oxynitride films are never stoichiometric, the fifth insulating film is relatively more silicon rich compared to most conventional silicon oxynitride films. The gas flow ratios during deposition are: 3:1 to 5:1 ($SiH_4:N_2O$), 4:1 to 6:1 ($N_2:N_2O$) and 10:1 to 14:1 ($N_2:SiH_4$). All other deposition parameters are conventional.

No films are perfect insulators, not even conventional insulating films, such as films 620, 624, and 626. Films 622 and 628 typically have portions that can have relatively higher amounts of silicon compared to conventional insulating films. Although films 620, 624, and 626 are closer to perfect insulators compared to films 622 and 628, films 622 and 628 are considered insulating films in this specification because they have properties more closely associated with insulators compared to semiconductors. Using insulating layer 62, the leakage current per memory cell in a finished semiconductor device is no greater than approximately 10 picoamperes when the potential difference between the $V_{DD}$ and $V_{SS}$ electrodes is approximately 1.8 volts and the memory cell is at a temperature of approximately 125 degrees Celsius. The leakage current per memory cell at the approximately 1.8 volt difference is usually less than 1 picoampere at room temperature (approximately 22 degrees Celsius). For an embodiment of the present invention, the leakage current for the memory cell at the approximately 1.8 volt difference is approximately 0.1 picoamperes at room temperature.

A patterned masking layer is then formed by coating a resist layer 64 on the pre-patterned surface 629 of the insulating layer 62, exposing portions of the resist layer 64, and developing the resist layer 64 to form masking layer openings, one of which is 66 as shown in FIG. 6. The masking layer openings correspond to locations where the conductive members 522, 524, 542, 544, 562, 564, 582, and 584 will be formed.

An etching sequence including a plurality of processing steps is performed during a single evacuation cycle in a single etching chamber. Alternatively, the etching sequence can be performed during a plurality of evacuation cycles or in a plurality of etching chambers. The five insulating films 620, 622, 624, 626, and 628 are etched using fluorine-containing gases. However, the actual fluorine-containing gases and the other gases in the etching plasma vary between the films. Note that the patterned masking layer is the only masking layer used to form the openings for conductive members 522, 524, 542, 544, 562, 564, 582, and 584. In other words, a dual-inlaid process sequence is not performed to form the conductive members 522, 524, 542, 544, 562, 564, 582, and 584.

A combination of trifluoromethane ($CHF_3$) and carbon tetrafluoride ($CF_4$) are used to etch through the fifth and fourth insulating films 626 and 628. The gas chemistry is switched after etching through the fifth film 628, so that it becomes relatively more lean with respect to $CF_4$ when etching the fourth insulating film 626. The $CHF_3:CF_4$ ratio is approximately 1:1 during the fifth insulating film etch 628, and the $CHF_3:CF_4$ ratio during the fourth insulating film 626 is approximately 10:1.

Etching the third insulating film 624 is difficult because the thickness of the film varies across the semiconductor device. As seen in FIG. 6, one portion of the third insulating film 624 is thinnest over the interconnect section 345 and insulating capping layer 44, another portion of the third insulating film 624 is much thicker over the silicide regions 610 that overlie the doped regions 284 and 244, and yet another portion of the film has an intermediate thickness over the suicide region 610 that overlies portion 425. These three different elevations make the etch difficult.

The third insulating film 624 is etched during a two-step process. The first portion removes most of the third insulating film 624 that overlies the insulating capping layer 44. The third insulating film is etched using a combination of octofluorobutene ($C_4F_8$), carbon monoxide (CO), and $CF_4$. The ratio of the $C_4F_8:CO:CF_4$ gases is approximately 1:7:2. The etch chemistry is changed before or just after reaching the second insulating film 622 over the insulating capping layer 44. The $CF_4$ gas flow is terminated, and the $C_4F_8$ and CO gases continue at substantially the same flow rates.

If a conventional nitride film, such as a plasma-enhanced nitride, were used for the second insulating film 622, most of the second insulating film 622 would be removed over the insulating capping layer 44 before reaching the portions of the second insulating film 622 overlies the silicide regions 610 that overlie the doped regions 244 and 284. A subsequent etching step to remove portions of the second insulating film 622 that overlie the silicide regions 610 would remove a significant amount of the insulating capping layer 44 and could form a leakage path or even an electrical short between the interconnect section 345 and the silicide regions 610. The greater silicon content within the second insulating film 622 (for the graded nitride embodiments) at the surface near the third insulating film 624 allows better etch selectivity between the second and third insulating films 622 and 624 during the etching of the third insulating film 624. The composition of the second insulating film 622 and the etch chemistry used near the end of the third insulating film 624 etch is chosen to allow selectivity (the etch rate of the third insulating film 624 to the etch rate of the second insulating film 622) to be at least 10:1.

Following the etching of the third insulating film, the etch chemistry is changed to etch through the graded silicon nitride of the second insulating film 622. in this particular embodiment, fluoromethane ($CH_3F$) and $O_2$ are used to etch through the second insulating film 622. In one particular embodiment, the ratio of the gases are such that the ratio of the $O_2$ to $CH_3F$ is in a range of 2:1 to 5:1. In one particular embodiment, the ratio is approximately 3:1. Following this step, the etch chemistry is again changed to etch through the first insulating film 620. The etch chemistry includes CO and $C_4F_8$ at a $CO:C_4F_8$ ratio of approximately 4:1. The radio frequency (RF) power used to etch the second insulating film 622 is about 20–30 percent of the RF power used during all of other steps to etch the insulating layer 62. A noble gas, including argon, helium, or the like, can be used during any or all of the etching steps. All other etching parameters are conventional. All etching steps are characterized as reactive ion etching. The etching steps form an opening 70 as shown in FIG. 7.

In the graded silicon nitride embodiments, the third insulating film 624 is capable of being removed selectively to the second insulating film 622 that includes graded silicon nitride. The first insulating film 620 is typically silicon dioxide, so that the second insulating film 622 can be removed without etching too much, if any, of the insulating capping layer 44. Although not shown in FIG. 7, portions of the first and second insulating films 622 and 620 may lie adjacent to the sidewall spacers 618 within opening 70. The presence of the insulating films 622 and 620 along the sides of the insulating spacers 618 should not cause any problems with subsequent processing since the leakage current per memory cell is acceptable.

As noted earlier, the first and second insulating films 620 and 622 can be replaced by a single film of a refractory metal oxide or a metal nitride. These films can be removed using a sputter etching process including a noble gas, such as argon, helium, krypton and the like. Thicker films typically require more overetching because of deposition and etching nonuniformities. The thickness of the refractory metal oxide or metal nitride should be kept thin because this etching process is not selective. Otherwise, an overetching portion of the step can remove too much of the silicide regions 610 or insulating capping layer 44.

An embodiment of the present invention includes using a low-k dielectric material for one or both of the first and second insulating films 620 and 622. Many low-k dielectric materials are organic (carbon containing) and may also contain fluorine. If an organic film is used, it can be removed using primarily oxygen and possibly having oxygen as the only active etching species during the etch.

An adhesion/barrier film 72 and a conductive film 74 are formed within the opening 70 and over the insulating layer 62. The adhesion/barrier film can include one or more films, such as a titanium/titanium nitride composite or the like. The conductive film 74 includes tungsten, doped silicon, aluminum, copper, or the like. The adhesion/barrier film 72 and conductive film 74 are typically formed by sputter deposition, chemical vapor deposition, or a combination thereof. Following the deposition, the substrate is then polished to remove portions of the films 72 and 74 that lie outside the opening 70.

The interconnect member 524 has been formed. Note that the conductive member 524 is part of a storage node for the SRAM cell. In this particular case, it connects the drain region of the latch transistor to a drain region of a load transistor that is electrically connected to the other conductive member that includes gate electrodes for the other two latch and load transistors of the same SRAM cell. More specifically, interconnect member 524 electrically connects the portion 425 of conductive member 32 and the doped regions 244 and 284 but is insulated from the interconnect section 345 of conductive member 34. The insulating capping layer 44 electrically insulates section 345 from the interconnect member 524 in a vertical direction, and spacers 618 and protective layer 616 electrically insulate section 345 from the interconnect member 524 in lateral directions.

The process allows the formation of conductive member 524 that electrically connects conductive regions (doped regions 244 or 284 with portion 425) of a memory cell that lie at different elevations. Also, the conductive member 524 electrically connects two conductive regions lying at substantially the same elevation while remaining insulated from yet another conductive region (interconnect section 345) that lies laterally between and at a higher elevation than the two conductive regions. All of this is achieved without using a dual-inlaid interconnect process flow that requires two different masks. Only one masking layer is required to form the opening 70.

The other conductive members 522, 542, 544, 562, 564, 582, and 584, which are conductive plugs, are formed during the same process sequence. FIG. 8 includes a similar structure for conductive member 522. It is used to connect doped regions 224 and 264 and portion 445 to one another. The silicide regions 610 help to reduce contact resistance. Within the memory cell, the portions of conductive members 32 and 34 that have silicide regions 610 are substantially only those portions that make electrical connection to the overlying conductive members 522 and 524. In other embodiments, silicide regions 610 within the memory cell are not required. The conductive members 522, 524, 542, 544, 562, 564, 582, and 584 can be made to directly contact the underlying doped silicon regions or layers.

Figure 9:
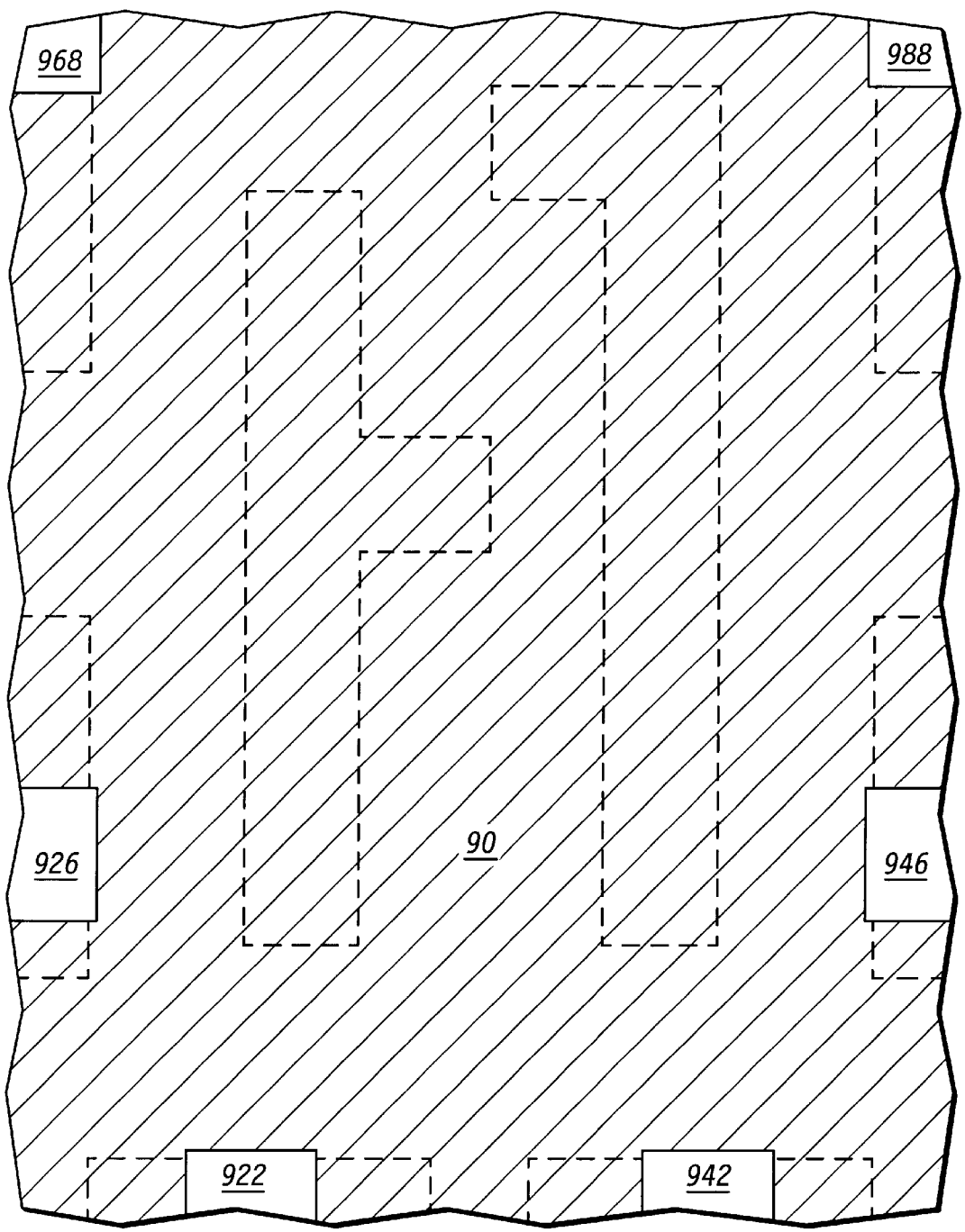
FIG. 9 includes an illustration of a top view of the memory cell after forming contact openings for the memory cell.

An interlevel dielectric layer 90 is formed by deposition and is patterned to form contact openings where conductive plugs 922, 926, 942, 946, 968, and 988 are being formed as shown in FIG. 9. Portions of underlying conductive members that lie outside the contact openings are illustrated with dashed lines in FIG. 9. Near the middle of FIG. 9, the conductive members illustrated with dashed lines are the conductive members that are part of the storage node connections. Therefore, no contacts are made to them at this level because they are intracell connections, and not intercell connections. Contact openings are then filled and form conductive plugs 922, 926, 942, 946, 968, and 988 similar to conductive members 522, 524, 542, 544, 562, 564, 582, and 584.

Figure 10:
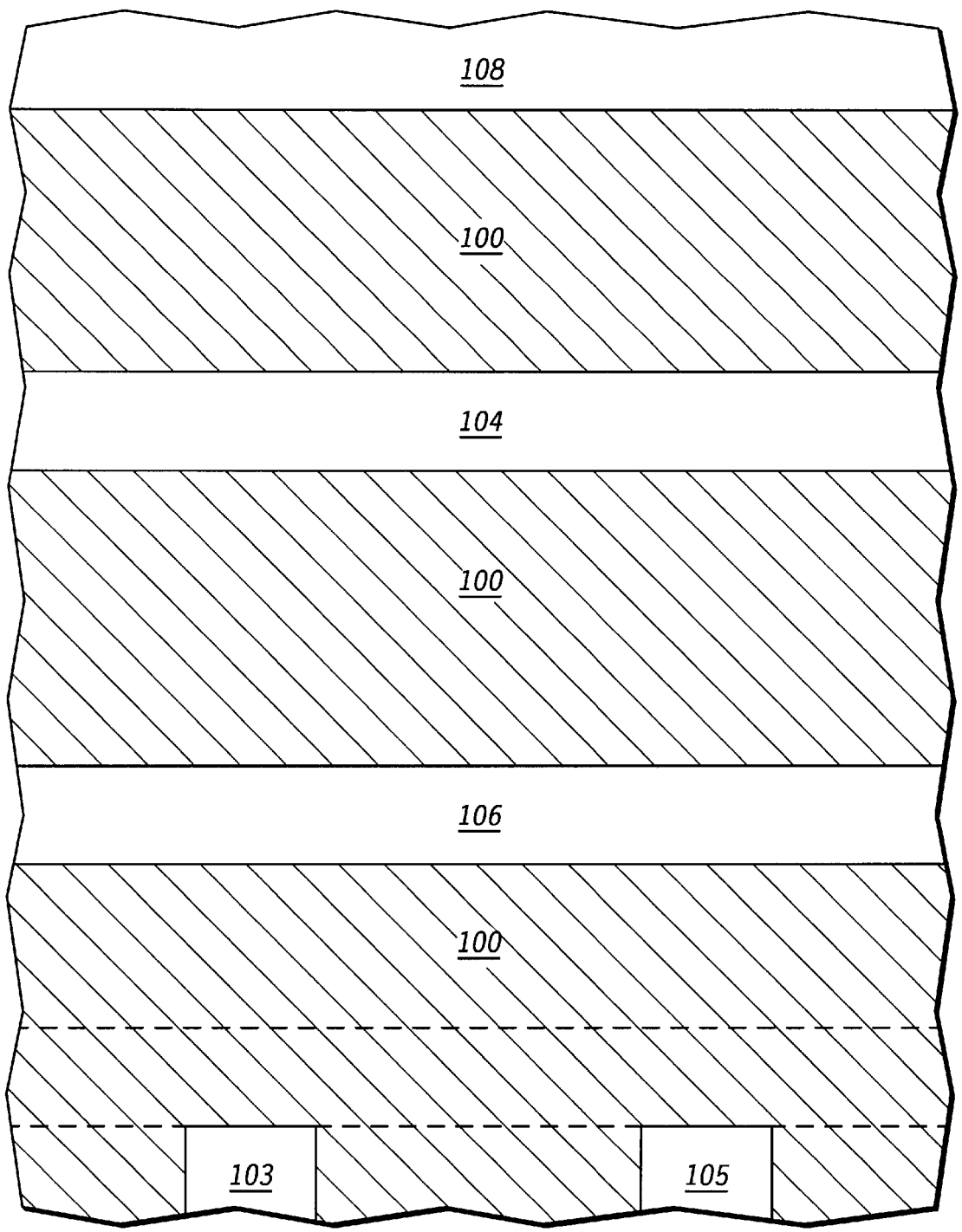
FIG. 10 includes an illustration of a top view of the memory cell after first level interconnects for the memory cell.

In FIG. 10, an insulating layer 100 is formed over the interlevel dielectric level 90 and is patterned to form interconnect trenches and expose underlying conductive plugs that lie within contact openings 942, 944, 962, 964, 982, and 984. The interconnect trenches 102 are filled to form interconnects 104, 106, and 108 and conductive landing pads 103 and 105. The word line includes interconnect 104 and conductive member 36. Interconnect 104 has a significantly lower resistance compared to conductive member 36, which is illustrated by dashed lines near the bottom of FIG. 10. Interconnect 104 typically makes an electrical connection (not shown in FIG. 9) every 16, 32, 64 or 128 memory cells. Within the memory cell, the interconnect 104 and conductive member 36 are substantially parallel to each other but interconnect 104 does not overlie the conductive member 36. Further, from a top view, interconnect 106 lies between interconnect 104 and conductive member 36. Interconnects 106 and 108 are electrically connected to the $V_{SS}$ and $V_{DD}$ electrodes, respectively. Conductive landing pads 103 and 105 are subsequently connected to bit lines for the memory cell.

Figure 11:
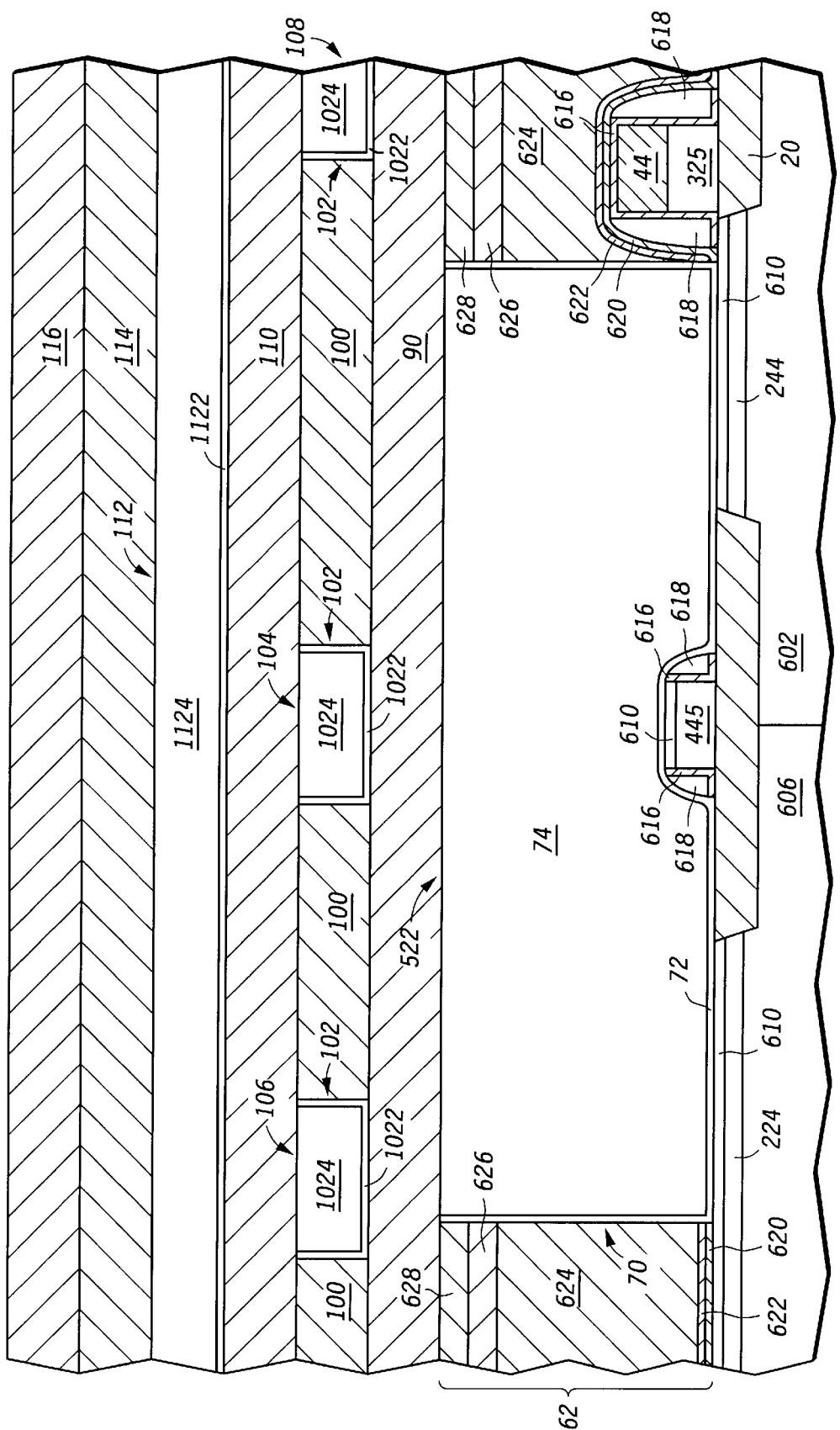
FIG. 11 includes an illustration of a cross-sectional view of the memory cell of FIG. 10 after forming a substantially completed device.

Processing continues to form a substantially completed semiconductor device as illustrated in FIG. 11, which is a cross-sectional view at substantially the same location as FIG. 8. Interconnects 104, 106, and 108 include an adhesion/barrier film 1022 and conductive fill material 1024 within interconnect trenches 102. Another interlevel dielectric layer 110 is formed over the interconnects 104, 106, and 108. Conductive plugs (not shown) are formed to conductive landing pads 103 and 105 (not shown in FIG. 11). Another insulating layer (not shown) is deposited and patterned to form interconnect trenches where the bit lines will be located. Interconnects, including bit line interconnect 112, are formed within the interconnect trenches. Interconnect 112 includes an adhesion/barrier film 1122 and conductive fill material 1124. Within the memory array, the bit line interconnects are the uppermost interconnects, as opposed to interconnects 106 and 108 that electrically connect power supply electrodes ($V_{DD}$ and $V_{SS}$) to components (i.e., transistors).

A passivation layer 114 and a die coat 116, such as polyimide, are formed over the interconnect 112. Other electrical connections are made to other portions of the semiconductor device but are not shown. Additional interlevel dielectric layers and interconnects can be formed if needed. The passivation layer 114 and die coat 116 are formed over the uppermost interconnect level.

The SRAM cell described can be used for a 0.25 micron process and can be scaled to even smaller geometries. Processing of the SRAM cell starting from the interlevel dielectric layer 90 is conventional. The conductive fill material 1024 and 1124 is typically aluminum or copper. As the device dimensions shrink, low-k dielectrics can be used for the interlevel dielectric layers and the insulating layer from which interconnect trenches are defined. The conductive fill layer is copper for very small geometry, fast SRAM cells.

The process described for forming the semiconductor device including the SRAM cell within an SRAM array has been formulated to take advantage of several different aspects. First, the memory cell is formed having six transistors formed within monocrystalline silicon, which generally forms a more stable SRAM cell compared to a four-transistor, two-resistor SRAM cell and has a better on-current to off-current ratio compared to a six-transistor SRAM cell with thin-film load transistors. The process uses less semiconductor layers compared to the four-transistor, two-resistor SRAM cell and the six-transistor SRAM cell with thin-film load transistors. Additional processing steps or other process complexity of adding additional polysilicon layers is avoided. Further, the process allows a one-mask process sequence to form conductive plugs for making the storage node connections to be formed over a plurality of features including conductive regions at different elevations.

Referring to FIG. 7, the conductive member 524 makes electrical connection to the silicide regions 610 over the doped regions 244 and 284 and portion 425 of the conductive member 32. However, conductive member 524 does not make electrical connection to the interconnect section 345 of conductive member 34. Clearly, the embodiments of the present invention are not limited only to static random access memory cells. The same type of process can be used for forming an inverter, series of inverters or other logic components within a semiconductor device. Although doped regions 244 and 284 have opposite conductivity types, other embodiments may form similar structures that connect doped regions of the same conductivity type.

The SRAM cell has a word line that includes the interconnect 104 and conductive member 36. Within the memory cell, the interconnect 104 does not directly overlie the conductive member 36. By placing the interconnect 104 as shown in FIG. 10, the interconnect 104 can help create more uniform spacing between the interconnects formed at the same revel that makes patterning easier due to consistent proximity effects. Also, the placement of interconnect 104 reduces the likelihood of an electrical short to the bit lines if the interconnect 104 were placed over the conductive member 36 within the memory cell. In other words, extra processing margin in the form of greater misalignment tolerance occurs with this embodiment.

This particular embodiment has portions of the conductive members silicided while other portions are not. Within the memory cell, only portions 425 and 445, which contact overlying conductive members 524 and 522, respectively, are silicided. Other portions of conductive members 32 and 34 include gate electrode sections that are not silicided because the speed of the device is not adversely affected by the non-silicided portions. The conductive member 36 does not have silicide or other metals within the memory cell. Most of the delay time when accessing data within an SRAM cell occurs with the peripheral circuitry, such as row and column decoders and sense amplifiers. These peripheral circuits are silicided which allows them to operate at relatively high speeds. Therefore, the non-silicided conductive members adds approximately 0.1 nanosecond delay time beyond the existing delay time. This additional a tenth of a nanosecond is relatively insignificant considering access times are typically at least a few nanoseconds in duration.

Although many films are used to form the insulating layer 62, and the etching of layer 62 includes several steps, process integration has occurred in some embodiments in which the use of existing materials can be performed without having to use unknown or exotic materials or processes that have not been properly characterized. In doing so, the integration of the process into an existing fab can typically be done without having to acquire new equipment.

Still another advantage to the embodiments of the present invention is that the memory cell can be shrunk to very small dimensions. In one particular embodiment, the cell should be capable of being formed at dimensions less than 0.3 micron and may be scaled down to 0.1 micron and possibly even smaller. The device is designed to operate with a $V_{DD}$ potential of approximately 1.8 volts, but the $V_{DD}$ potential could be higher or can possibly be reduced to 0.9 volt or even lower. Therefore, this device allows very aggressive design rules to be used. Certain portions of the memory device such as the gate electrodes can be reduced even further to increase the speed of the device.

Although not shown, other implants are used to adjust threshold voltages, and reduce the likelihood of channel and field punchthrough, etc. Additional implants for lightly doped drains (LDDs) can be performed. However, at very small dimensions and low potentials, these LDD regions can become unnecessary or undesired due to the reduced amount of voltage required for channel punchthrough or to control of those dopant (diffusion) from the these regions.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

What is claimed is:

1. A semiconductor device comprising:
   a substrate having a primary surface;
   a first doped region and a second doped region, each lying within the substrate near its primary surface;
   a first conductive member overlying a portion of the primary surface of the substrate, wherein from a top view:
      the portion is located between the first doped region and the second doped region; and
      the first conductive member has a shape;
   a first insulating layer overlying the first conductive member, wherein, from a top view, the first insulating layer has a shape substantially similar to the shape of the first conductive member;
   a second insulating layer having a first opening;
   a first interconnect electrically connecting the first doped region to the second doped region, wherein:
      the first interconnect extends over the first conductive member and the first insulating layer;
      the first interconnect is an inlaid interconnect lying within the first opening of the second insulating layer; and
      within the first opening of the second insulating layer, the first interconnect is electrically insulated from the first conductive member in a vertical direction only by the first insulating layer.

2. The semiconductor device of claim 1, wherein the first and second doped regions are parts of different transistors.

3. The semiconductor device of claim 1, further comprising a second conductive member overlying the primary surface of the substrate, wherein:

the second conductive member lies at an elevation higher than the first and second doped regions; and the first interconnect is electrically connected to the second conductive member within the first opening.

4. The semiconductor device of claim 1, further comprising:

a third doped region and a fourth doped region near the primary surface of the substrate;

a second conductive member overlying the primary surface of the substrate; and a second interconnect that overlies and is electrically connected to the third and fourth doped regions and the first conductive member, wherein the second interconnect is an inlaid interconnect lying within a second opening of the second insulating layer, wherein the first interconnect is electrically connected to the first and second doped regions and the second conductive member.

5. A memory cell comprising:

a substrate;

a field isolation region overlying a portion of the substrate a gate dielectric layer overlying a different portion of the substrate; and a first conductive member overlying the field isolation region and the gate dielectric layer, wherein:

the first conductive member includes an interconnect section and a gate electrode section; and a first silicide region lies on the interconnect section of the first conductive member but no silicide lies on the gate electrode section of the first conductive member.

6. The memory cell of claim 5, further comprising a second conductive member and a third conductive member, wherein, within the memory cell:

the second and third conductive members overlie the field isolation region and the gate dielectric layer;

the second conductive member includes an interconnect section and a gate electrode section;

a second silicide region lies on the interconnect section of the second conductive member but no silicide overlies the gate electrode section of the second conductive member; and no silicide lies on the third conductive member.

7. The memory cell of claim 6, further comprising:

an insulating layer at least 1000 angstroms thick;

a first interconnect that is inlaid within the insulating layer and contacts the first silicide region; and a second interconnect that is inlaid within the insulating layer and contacts the second silicide region.

8. The memory cell of claim 5, further comprising doped regions within the substrate near its primary surface, wherein each of the doped regions has a silicide region overlying it.

9. The memory cell of claim 5, wherein the memory cell is an SRAM cell, and the gate electrode section is a gate electrode for a latch transistor within the SRAM cell.

10. A semiconductor device comprising:

a first conductive region lying at a first elevation;

a second conductive region lying at a second elevation that is higher than the first elevation;

a first insulating film overlying the first and second conductive regions, wherein the first insulating film includes a material selected from a group consisting of a graded nitride, a metal nitride, a refractory metal oxide, and a low-k dielectric;

a second insulating film overlying the first insulating film and having a thickness of at least approximately 1000 angstroms, wherein the second insulating film is capable of being removed at different rate compared to the first insulating film;

an opening extending through the first and second insulating films over the first and second conductive regions; and an interconnect electrically connected to at least one of the first and second conductive regions, wherein the interconnect substantially fills the opening.

11. The semiconductor device of claim 10, further comprising a third insulating film overlying at least a portion of the second conductive region at a location between the second conductive region and the interconnect, wherein, within the opening, the second conductive region is electrically insulated from the interconnect by at least the third insulating film.

12. The semiconductor device of claim 10, further comprising a third conductive region lying at about the second elevation, wherein:

the first conductive region includes a first silicide region;

the third conductive region includes a second silicide region; and the interconnect contacts and is electrically connected to the first and second silicide regions.

13. The semiconductor device of claim 12, further comprising a fourth conductive region, which from a top view, lies between the second and third conductive regions, wherein the fourth conductive region includes a third silicide region, is at approximately the first elevation, and electrically connected to the interconnect.

14. The semiconductor device of claim 12, wherein:

the semiconductor device includes a first transistor and a second transistor;

the first conductive region is a drain region of the first transistor;

the second conductive region includes gate electrode sections of the first and second transistors; and the first and third conductive regions are electrically connected to each other by the interconnect.

15. A semiconductor device including a memory array that comprises:

components formed at a primary surface of a substrate;

a first insulating layer overlying the components;

first level interconnects overlying the first insulating layer, wherein the first level interconnects are electrically connected to power supply electrodes;

a second insulating layer overlying the first level interconnects; and second level interconnects overlying the second insulating layer, wherein within the memory array:

the second level interconnects include bit lines; and the second level interconnects lie at an elevation higher than all interconnects that supply power to memory cells within the memory array.

16. The semiconductor device of claim 15, wherein the first level interconnects further comprise interconnects that are parts of word lines for the memory array that includes a plurality of random-access memory cells.

17. The semiconductor device of claim 16, wherein the second level interconnects are uppermost interconnects within the memory array.

18. A semiconductor device comprising:

a word line within a memory cell wherein the world line does not contain any significant amount of silicide;

peripheral circuitry containing gate electrodes that are not used for input protection circuitry wherein the gate electrodes contain significant amounts of silicide.

19. A semiconductor device comprising:

a gate electrode section within the peripheral circuitry wherein the gate electrode section is doped with a first dopant and a second dopant having the same conductivity as the first dopant; and a gate electrode section within the memory cell wherein the gate electrode section is a polysilicon layer doped with the first dopant and not the second dopant.

20. The semiconductor device in claim 19 wherein the first dopant is phosphorus and the second dopant is arsenic.

* * * * *

UNITED STATES PATENT AND TRADEMARK OFFICE
CERTIFICATE OF CORRECTION

PATENT NO. : 6,686,633 B1
DATED : February 3, 2004
INVENTOR(S) : Lage et al.

It is certified that error appears in the above-identified patent and that said Letters Patent is hereby corrected as shown below:

Column 15,
Line 20, replace claim 5 with:
--
"A memory cell comprising:

a substrate having a primary surface;

a first doped region and a second doped region, each lying within the substrate near its primary surface;

a field isolation region overlying a portion of the substrate;

a gate dielectric layer overlying a different portion of the substrate; and a first conductive member overlying the field isolation region, and the gate dielectric layer and a portion of the primary surface, wherein:

the first conductive member includes an interconnect section and a gate electrode section; and a first silicide region lies on the interconnect section of the first conductive member but no silicide lies on the gate electrode section of the first conductive member; and wherein from a top view:

the portion of the primary surface is located between the first doped region and the second doped region; and the first conductive member has a shape;

a first insulating layer overlying the first conductive member, wherein, from a top view, the first insulating layer has a shape substantially similar to the shape of the first conductive member;

a second insulating layer having a first opening;

a first interconnect electrically connecting the first doped region to the second doped region, wherein:

the first interconnect extends over the first conductive member and the first insulating layer;
--

UNITED STATES PATENT AND TRADEMARK OFFICE
CERTIFICATE OF CORRECTION

PATENT NO. : 6,686,633 B1
DATED : February 3, 2004
INVENTOR(S) : Lage et al.

It is certified that error appears in the above-identified patent and that said Letters Patent is hereby corrected as shown below:

Column 15,
Line 58, replace claim 10 with:

-- A semiconductor device comprising:
    a substrate having a primary surface;
    a first doped region and a second doped region, each lying within the substrate near its primary surface;

a first conductive region lying at a first elevation;
    a second conductive region lying at a second elevation that is higher than the first elevation;
    a first conductive member overlying a portion of the primary surface of the substrate, wherein from a top view:
        the portion is located between the first doped region and the second doped region; and
        the first conductive member has a shape;
    a first insulating film overlying the first and second conductive regions and the first conductive member, wherein the first insulating film includes a material selected from a group consisting of a graded nitride, a metal nitride, a refractory metal oxide, and a low-k dielectric and wherein, from a top view, the first insulating layer has a shape substantially similar to the shape of the first conductive member;
    a second insulating film overlying the first insulating film and having a thickness of at least approximately 1000 angstroms, wherein the second insulating film is capable of being removed at different rate compared to the first insulating film;

an opening extending through the first and second insulating films over the first and second conductive regions; and
    an interconnect electrically connected to at least one of the first and second conductive regions and connecting the first doped region to the second doped region, wherein:
    the interconnect substantially fills the opening;
    the interconnect extends over the first conductive member and the first insulating film;

the interconnect is an inlaid interconnect lying within the opening of the second insulating film; and
        within the opening of the second insulating film, the first interconnect is electrically insulated from the first conductive member in a vertical direction only by the first insulating film." --

UNITED STATES PATENT AND TRADEMARK OFFICE
CERTIFICATE OF CORRECTION

PATENT NO. : 6,686,633 B1
DATED : February 3, 2004
INVENTOR(S) : Lage et al.

It is certified that error appears in the above-identified patent and that said Letters Patent is hereby corrected as shown below:

<u>Column 16,</u>
Line 45, Replace claim 15 with:
--
"A semiconductor device including a memory array that comprises:
    components formed at a primary surface of a substrate;, wherein the components include:
    a first doped region and a second doped region, each lying within the substrate near its
        primary surface;
    a first conductive member overlying a portion of the primary surface of the substrate, wherein
        from a top view:
            the portion is located between the first doped region and the second doped region;
            and
            the first conductive member has a shape;
    a first insulating layer overlying the first conductive member, wherein, from a top view, the first
        insulating layer has a shape substantially similar to the shape of the first conductive
        member;
    a second insulating layer having a first opening;
    a first interconnect electrically connecting the first doped region to the second doped region,
        wherein:
        the first interconnect extends over the first conductive member and the first insulating
            layer;
        the first interconnect is an inlaid interconnect lying within the first opening of the
            second insulating layer; and
        within the first opening of the second insulating layer, the first interconnect is
            electrically insulated from the first conductive member in a vertical direction
            only by the first insulating layer;
    a first third insulating layer overlying the components;
    first level interconnects overlying the first third insulating layer, wherein the first level
        interconnects are electrically connected to power supply electrodes;
    a second fourth insulating layer overlying the first level interconnects; and
    second level interconnects overlying the second fourth insulating layer, wherein within the
        memory array:
        the second level interconnects include bit lines; and
        the second level interconnects lie at an elevation higher than all interconnects that
            supply power to memory cells within the memory array."
--

UNITED STATES PATENT AND TRADEMARK OFFICE
CERTIFICATE OF CORRECTION

PATENT NO. : 6,686,633 B1
DATED : February 3, 2004
INVENTOR(S) : Lage et al.

It is certified that error appears in the above-identified patent and that said Letters Patent is hereby corrected as shown below:

<u>Column 17,</u>
Line 1, delete the entire claim 18.
Line 7, delete the entire claim 19.

<u>Column 18,</u>
Line 1, delete the entire claim 20.

Signed and Sealed this

Eighth Day of June, 2004

JON W. DUDAS
*Acting Director of the United States Patent and Trademark Office*